(12) United States Patent
Su et al.

(10) Patent No.: US 8,061,893 B2
(45) Date of Patent: Nov. 22, 2011

(54) TESTING SYSTEM AND METHOD FOR MOTOR

(75) Inventors: Yi-Cheng Su, Taipei Hsien (TW);
Yin-Jao Luo, Taipei Hsien (TW);
Shao-Chung Yuan, Taipei Hsien (TW);
An-Zheng Yang, Taipei Hsien (TW);
Chia-Ching Lin, Taipei Hsien (TW);
Han-Chieh Chang, Taipei Hsien (TW)

(73) Assignee: Foxnum Technology Co., Ltd., Tu-Cheng, New Taipei (TW)

( * ) Notice: Subject to any disclaimer, the term of this patent is extended or adjusted under 35 U.S.C. 154(b) by 490 days.

(21) Appl. No.: 12/353,978

(22) Filed: Jan. 15, 2009

(65) Prior Publication Data
US 2010/0162828 A1      Jul. 1, 2010

(30) Foreign Application Priority Data
Dec. 26, 2008   (CN) .......................... 2008 1 0306563

(51) Int. Cl.
*G01K 1/12*     (2006.01)
*G01K 1/14*     (2006.01)
*G01K 13/08*    (2006.01)
*H02P 1/00*     (2006.01)
*G01R 31/06*    (2006.01)

(52) U.S. Cl. ........ 374/153; 374/141; 374/183; 374/163; 374/152; 318/490; 73/860; 324/765.01

(58) Field of Classification Search .................. 324/378, 324/772, 500, 510, 512, 527, 750.01, 750.16, 324/756.01, 765.01, 555, FOR. 122; 73/862, 73/114.01, 860; 318/490, 1, 34, 727; 477/2, 477/3, 7, 98; 701/22
See application file for complete search history.

(56) References Cited

U.S. PATENT DOCUMENTS

| | | | | |
|---|---|---|---|---|
| 4,796,142 A * | 1/1989 | Libert | ............... | 361/23 |
| 5,206,572 A * | 4/1993 | Farag et al. | ............... | 318/778 |
| 5,420,523 A * | 5/1995 | Walker et al. | ............... | 324/765.01 |
| 6,262,550 B1 * | 7/2001 | Kliman et al. | ............... | 318/565 |
| 6,308,140 B1 * | 10/2001 | Dowling et al. | ............... | 702/60 |
| 7,024,299 B2 * | 4/2006 | Hubbard et al. | ............... | 701/54 |
| 7,368,886 B2 * | 5/2008 | Hsieh et al. | ............... | 318/430 |
| 7,769,552 B2 * | 8/2010 | Colby et al. | ............... | 702/65 |
| 7,956,637 B2 * | 6/2011 | Lu et al. | ............... | 324/765.01 |
| 7,969,138 B2 * | 6/2011 | Sheahan | ............... | 324/76.11 |
| 2005/0256618 A1 * | 11/2005 | Hsieh et al. | ............... | 701/22 |
| 2008/0258667 A1 * | 10/2008 | Morris et al. | ............... | 318/490 |

* cited by examiner

*Primary Examiner* — Gail Verbitsky
(74) *Attorney, Agent, or Firm* — Altis Law Group, Inc.

(57) ABSTRACT

A testing system for testing a temperature characteristic of a first motor includes a second motor, a controller, a driver, a load, a temperature sensor, and a temperature recorder. The controller provides a drive command for the driver to drive the second motor. The second motor drives the first motor via a coupling. A current of the first motor is determined by adjusting the resistance of the load. The temperature sensor senses the temperatures of the first motor every a determined time and sends the temperatures to the temperature recorder. The temperature recorder records and transmits the temperatures to the controller for the temperature characteristic test of the first motor.

11 Claims, 3 Drawing Sheets

TESTING SYSTEM AND METHOD FOR MOTOR

BACKGROUND

1. Technical Field

The present disclosure relates to testing systems and methods, and particularly, to a testing system and method for testing a temperature characteristic of a motor.

2. Description of the Related Art

If a motor operates at temperature above what it is rated for, it could have a shorter life than expected. Therefore, it is important to perform a temperature characteristic test on motors in the manufacturing process. A conventional temperature characteristic testing system includes a driver providing the motor current to drive the motor to rotate at a rated speed. However, the current provided for the motor by the driver may raise the temperature of the motor, for example, when the current contains impulse noise or high-order harmonics. Therefore, it is hard to determine whether high operating temperatures of a motor under test are the result of a problem with the motor or the driver.

DETAILED DESCRIPTION

Figure 1:
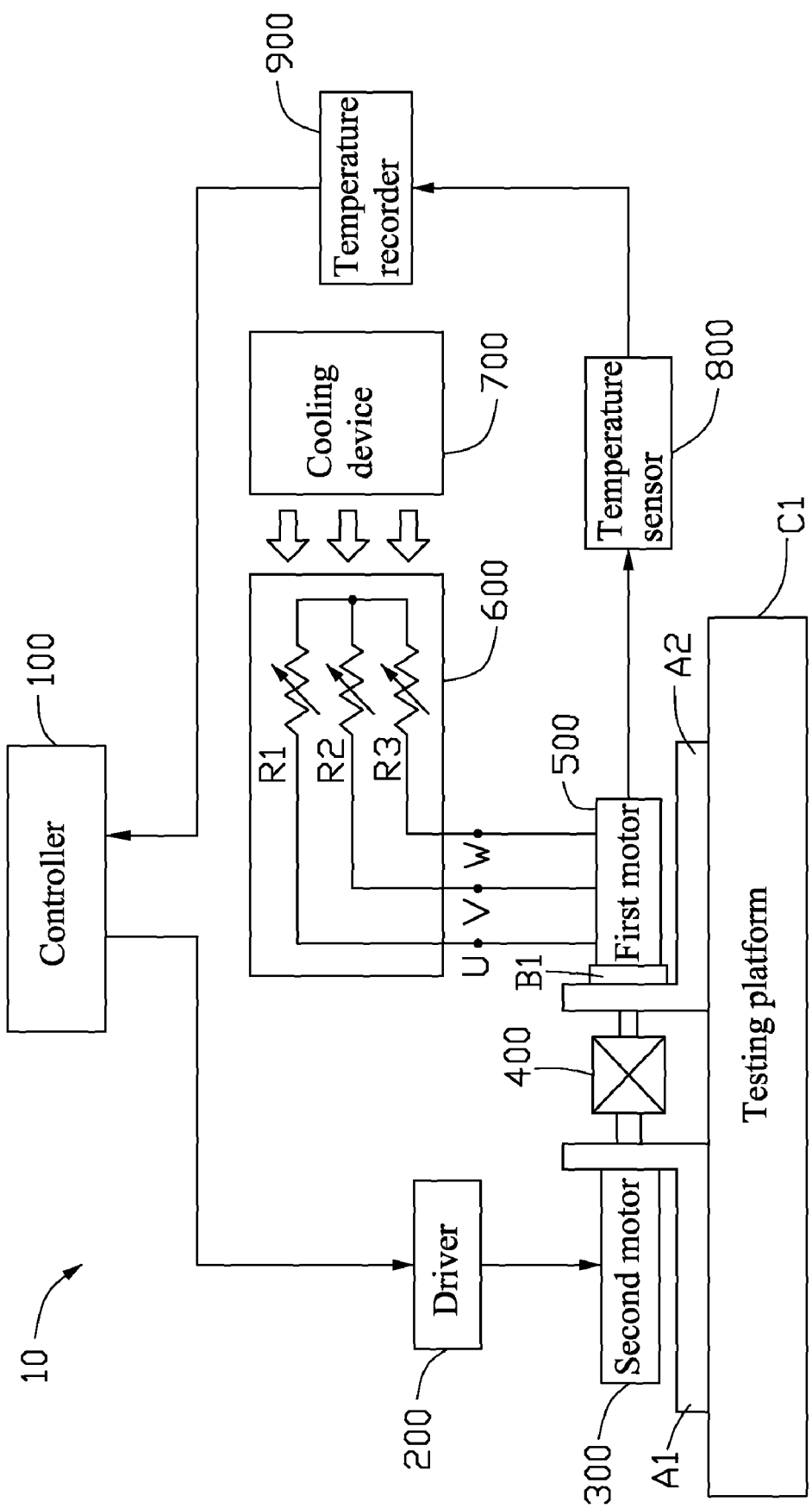
FIG. 1 is a block diagram of an exemplary embodiment of a testing system for a motor.

Referring to FIG. 1, an exemplary embodiment of a testing system 10 for a first motor 500 includes a controller 100, a driver 200, a second motor 300, a coupling 400, a load 600, a cooling device 700, a temperature sensor 800, a temperature recorder 900, a first fastening board A1, a second fastening board A2, a heat insulation board B1, and a testing platform C1. The load 600 includes a first variable resistor R1, a second variable resistor R2, and a third variable resistor R3.

In one exemplary embodiment, the controller 100 is a personal computer, the first motor 500 is a permanent-magnet motor. The first fastening board A1 and the second fastening board A2 are two L-shaped boards fixed to the testing platform C1, and correspondingly configured for fastening the second motor 300 and the first motor 500. The driver 200 is connected between the controller 100 and the second motor 300, and configured for receiving a drive command from the controller 100 to drive the second motor 300. The second motor 300 is connected to the first motor 500 via the coupling 400, and configured for driving the first motor 500 via the coupling 400. The heat insulation board B1 is mounted between the first motor 500 and the second fastening board A2, and configured for preventing the heat of the first motor 500 from transferring to the second fastening board A2 thereby affecting the temperature characteristic test of the first motor 500. Three-phase inputs U, V, W of the first motor 500 are correspondingly connected to first ends of the first variable resistor R1, the second variable resistor R2, and the third variable resistor R3 of the load 600. Second ends of the first variable resistor R1, the second variable resistor R2, and the third variable resistor R3 of the load 600 are connected to one another.

In one exemplary embodiment, the cooling device 700 is a cooling fan configured for cooling the load 600, to prevent the heat of the load 600 from transferring to the stator winding (not shown) of the first motor 500 which could affect the temperature characteristic test of the first motor 500. The temperature sensor 800 is connected to the first motor 500, and configured for sensing the temperature of the first motor 500. The temperature recorder 900 is connected between the temperature sensor 800 and the controller 100, and is configured for recording the temperature of the first motor 500 sensed by the temperature sensor 800 and transmitting the temperature of the first motor 500 to the controller 100 for the temperature characteristic test.

In use, the controller 100 transmits a drive command to the driver 200 to drive the second motor 300 to rotate at a speed V1. The second motor 300 drives the first motor 500 via the coupling 400 to rotate at the same speed V1. Therefore, the three-phase inputs U, V, W of the first motor 500 together produce an alternating current (AC) voltage which is equal to a back electromotive force U1 of the first motor 500. The back electromotive force U1 is in a direct proportion to the speed V1 of the first motor 500. Therefore, a current I1 passes through the stator winding of the first motor 500. A function U1=I1*R is used according to Ohm's law, where the value R is equal to a summation of an equivalent resistance of the variable resistors R1, R2, and R3 in parallel and the resistance of the first motor 500 itself. The current I1 can be set to a certain value by adjusting the resistances of the resistors R1, R2, and R3. The value of the current I1 can be measured with a current clamp (not shown).

The first motor 500 is operated at the speed V1 and the current I1, then the temperature sensor 800 senses the temperature of the first motor 500 and transmits the temperature to the temperature recorder 900 at predetermined intervals. The temperature recorder 900 records the temperature and transmits the temperature to the controller for a temperature characteristic analysis of the first motor 500, for example, to graph a temperature characteristic curve. Once the temperature characteristic curve of the first motor 500 with the current I1 is obtained, the resistance(s) of the variable resistors R1, R2, and R3 of the load 600 may be adjusted again to set another current I2. Another temperature characteristic curve of the first motor 500, with the current I2, can be obtained according to the above method. Thereby, a plurality of temperature characteristic curves of the first motor 500 operating at different currents can be obtained. The first motor 500 can be determined to be qualified or not by analyzing the plurality of temperature characteristic curves.

Figure 2:
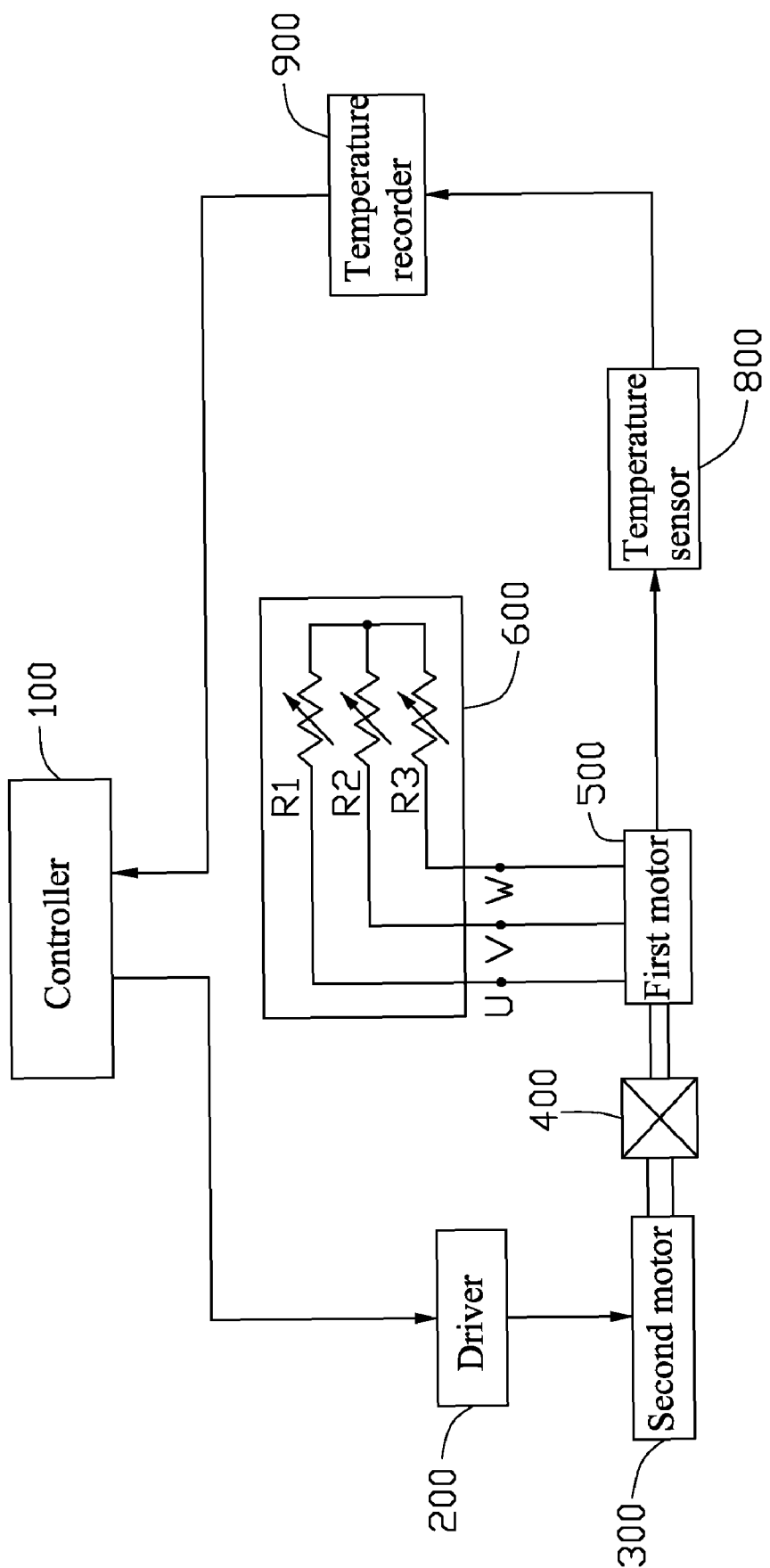
FIG. 2 is a block diagram of another exemplary embodiment of a testing system for a motor.

Referring to FIG. 2, in another exemplary embodiment, the first fastening board A1, the second fastening board A2, the heat insulation board B1, the testing platform C1, and the cooling device 700 can be omitted to save on cost.

Figure 3:
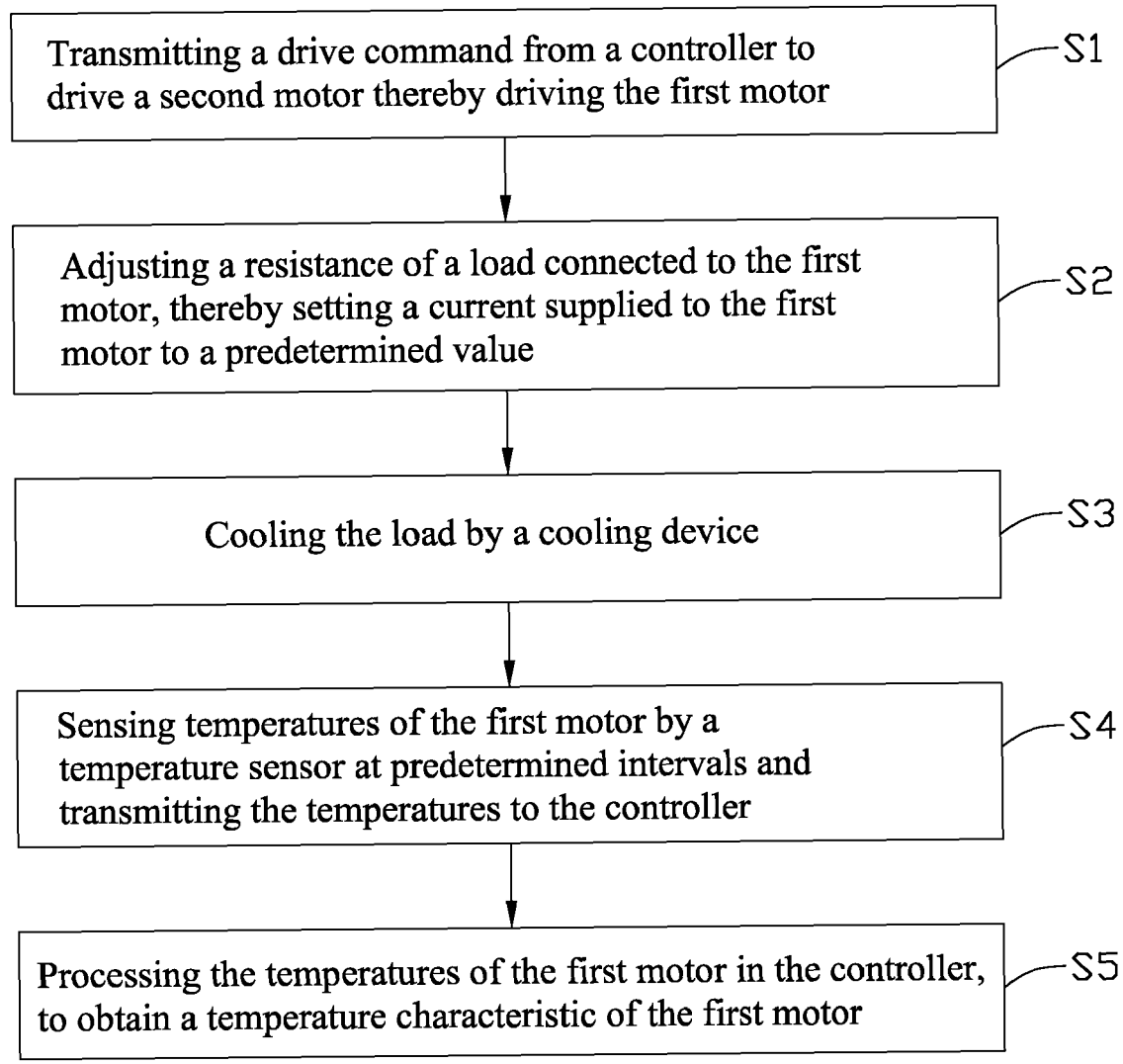
FIG. 3 is a flowchart of an exemplary embodiment of a testing method for a motor.

Referring to FIG. 3, a method of a testing system for testing a temperature characteristic of the first motor 500 is provided, which includes the following steps.

In step S1, the controller 100 transmits the drive command to drive the second motor 300 thereby driving the first motor 500.

In step S2, the resistance of the load 600 connected to the first motor 500 is adjusted thereby setting the current I1 supplied to the first motor 500 to a predetermined value.

In step S3, the cooling device 700 is used to cool the load 600.

In step S4, the temperatures of the first motor 500 are sensed by the temperature sensor 800 at predetermined intervals and transmitted to the controller 100.

In step S5, the controller 100 processes the temperatures of the first motor 500 to obtain a temperature characteristic of the first motor 500.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A testing system for testing a temperature characteristic of a first motor that comprises three-phase inputs, comprising:
   a second motor connected to the first motor via a coupling, and configured for driving the first motor via the coupling;
   a controller configured for providing a drive command and processing test data;
   a driver connected between the controller and the second motor, and configured for receiving the drive command from the controller to drive the second motor;
   a load connected to the inputs of the first motor, and configured for determining a current passing through the first motor by adjusting the resistance of the load;
   a temperature sensor connected to the first motor, and configured for sensing the temperature of the first motor; and
   a temperature recorder connected between the temperature sensor and the controller, and configured for recording the temperature sensed by the temperature sensor and transmitting the temperature to the controller for performing a temperature characteristic analysis.

2. The testing system of claim 1, wherein the load comprises a first variable resistor, a second variable resistor, and a third variable resistor; wherein first ends of the first variable resistor, the second variable resistor, and the third variable resistor are correspondingly connected to the three-phase inputs of the first motor, and second ends of the first variable resistor, the second variable resistor, and the third variable resistor are connected to one another.

3. The testing system of claim 1, further comprising a cooling device for cooling the load.

4. The testing system of claim 1, wherein the second motor is fastened by a fastening board.

5. The testing system of claim 1, further comprising a heat insulation board; wherein the heat insulation board is capable of being mounted to the first motor to insulate heat for the first motor.

6. The testing system of claim 1, wherein the controller is further configured to graph a temperature characteristic curve relative to the current passing through the first motor in the temperature characteristic analysis.

7. A testing method for a testing temperature characteristic of a first motor, comprising:
   providing a second motor connected to the first motor via a coupling;
   providing a controller to provide a drive command and processing test data;
   transmitting the drive command from the controller to the driver for driving a second motor thereby driving the first motor via the coupling;
   adjusting a resistance of a load connected to the three-phases inputs of first motor, thereby setting a current supplied to the first motor to a predetermined value;
   sensing temperatures of the first motor by a temperature sensor at predetermined intervals and transmitting the temperatures to a temperature recorder; and
   transmitting the temperatures to the controller from the temperature recorder and processing the temperatures of the first motor in the controller, to obtain a temperature characteristic of the first motor.

8. The testing method of claim 7, wherein the load comprises a first variable resistor, a second variable resistor, and a third variable resistor; wherein first ends of the first variable resistor, the second variable resistor, and the third variable resistor are correspondingly connected to the three-phase inputs of the first motor, and second ends of the first variable resistor, the second variable resistor, and the third variable resistor are connected to one another.

9. The testing method of claim 7, further comprising providing a cooling device to cool the load.

10. The testing method of claim 7, further comprising fastening the second motor is fastened by a fastening board.

11. The testing method of claim 7, further comprising providing a heat insulation board mounted to the first motor to insulate heat for the first motor.

* * * * *